United States Patent
Daniel

(10) Patent No.: US 9,124,365 B2
(45) Date of Patent: Sep. 1, 2015

(54) ENHANCED MOBILE DEVICE AUDIO PERFORMANCE

(71) Applicant: Cellco Partnership, Arlington, VA (US)

(72) Inventor: Tom Daniel, Monmouth Junction, NJ (US)

(73) Assignee: Cellco Partnership, Basking Ridge, NJ (US)

( * ) Notice: Subject to any disclaimer, the term of this patent is extended or adjusted under 35 U.S.C. 154(b) by 111 days.

(21) Appl. No.: 13/839,713

(22) Filed: Mar. 15, 2013

(65) Prior Publication Data

US 2014/0269945 A1    Sep. 18, 2014

(51) Int. Cl.
| H04B 14/04 | (2006.01) |
| H04B 17/21 | (2015.01) |
| H04W 52/24 | (2009.01) |
| H04W 52/52 | (2009.01) |

(52) U.S. Cl.
CPC ............ *H04B 17/21* (2015.01); *H04W 52/243* (2013.01); *H04W 52/52* (2013.01)

(58) Field of Classification Search
CPC .. G10L 19/173; H03M 1/185; H04B 17/0062
USPC .............. 375/254; 704/E19.001, 225; 381/17
See application file for complete search history.

(56) References Cited

U.S. PATENT DOCUMENTS

| 4,630,305 | A * | 12/1986 | Borth et al. ................. 381/94.3 |
| 4,991,218 | A * | 2/1991 | Kramer ........................ 381/61 |
| 5,479,168 | A * | 12/1995 | Johnson et al. ............... 341/110 |
| 5,579,004 | A * | 11/1996 | Linz ............................ 341/144 |
| 5,809,466 | A * | 9/1998 | Hewitt et al. ................. 704/258 |
| 6,233,554 | B1 * | 5/2001 | Heimbigner et al. ......... 704/225 |
| 7,424,332 | B2 * | 9/2008 | Okayama et al. ............. 700/94 |
| 2005/0013443 | A1 * | 1/2005 | Marumoto et al. ............ 381/56 |
| 2005/0015252 | A1 * | 1/2005 | Marumoto ................... 704/234 |
| 2005/0038664 | A1 * | 2/2005 | Srinivas et al. .............. 704/501 |
| 2008/0019533 | A1 * | 1/2008 | Noguchi et al. ............... 381/17 |
| 2008/0146281 | A1 * | 6/2008 | Cohen et al. ................. 455/558 |
| 2009/0036067 | A1 * | 2/2009 | Rofougaran .................. 455/91 |
| 2009/0319279 | A1 * | 12/2009 | Kong et al. .................. 704/500 |
| 2010/0204996 | A1 * | 8/2010 | Zeng et al. .................. 704/500 |
| 2010/0303228 | A1 * | 12/2010 | Zeng et al. ............... 379/406.08 |
| 2010/0304679 | A1 * | 12/2010 | Zeng et al. .................. 455/63.1 |
| 2011/0222711 | A1 * | 9/2011 | Kong et al. .................. 381/108 |
| 2012/0133411 | A1 * | 5/2012 | Miao et al. .................. 327/306 |

* cited by examiner

*Primary Examiner* — Daniel Washburn
*Assistant Examiner* — Amneet Singh

(57) ABSTRACT

A mobile device includes a processing device that converts a digital input signal to an analog output signal and a memory device that stores a plurality of gain tables, each including values associated with processing the digital input signal. The mobile device further includes at least one filter and at least one amplifier. The processing device is configured to select one of the plurality of gain tables based on the signal strength of the digital input signal and apply one or more values in the selected gain table to the filter, the amplifier, or both, to process the digital input signal, the analog output signal, or both. A method includes receiving a digital input signal, identifying a signal strength of the digital input signal, selecting one of a plurality of gain tables, and processing the digital input signal based on the selected gain table.

18 Claims, 3 Drawing Sheets

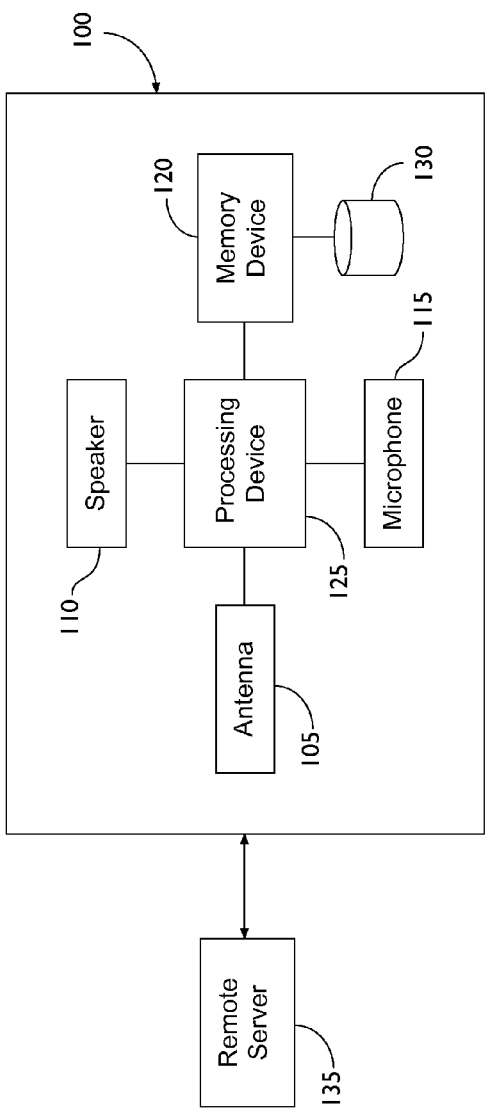
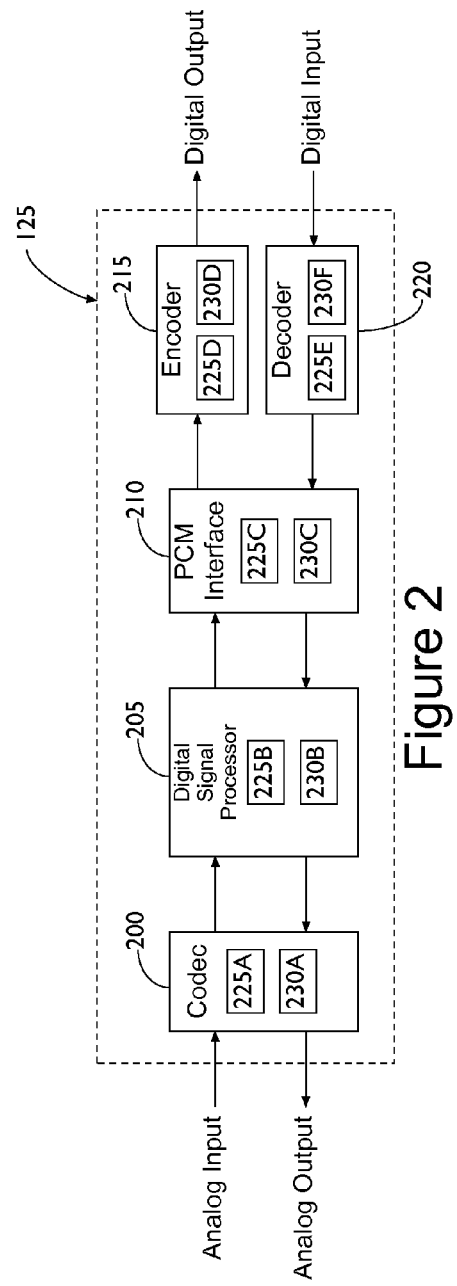

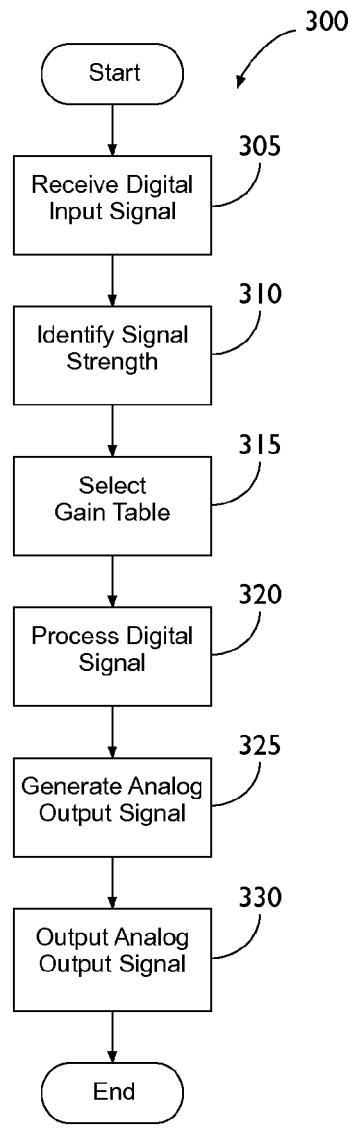
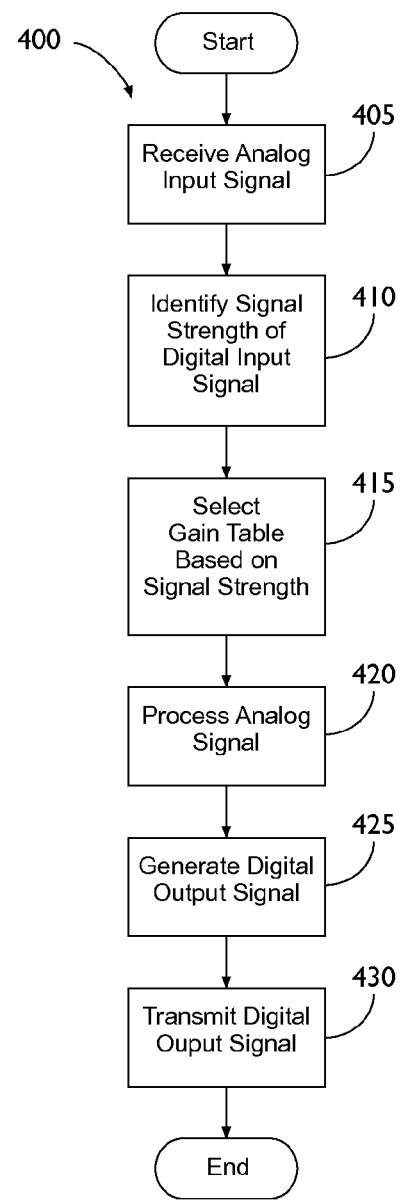
Figure 3
Figure 4

| Component | Condition A |
|---|---|
| Filter 225A | Filter_A1 |
| Filter 225B | Filter_A2 |
| Filter 225C | Filter_A3 |
| Filter 225D | Filter_A4 |
| Filter 225E | Filter_A5 |
| Amplifier 230A | Gain_A1 |
| Amplifier 230B | Gain_A2 |
| Amplifier 230C | Gain_A3 |
| Amplifier 230D | Gain_A4 |
| Amplifier 230E | Gain_A5 |

Figure 5A

| Component | Condition B |
|---|---|
| Filter 225A | Filter_B1 |
| Filter 225B | Filter_B2 |
| Filter 225C | Filter_B3 |
| Filter 225D | Filter_B4 |
| Filter 225E | Filter_B5 |
| Amplifier 230A | Gain_B1 |
| Amplifier 230B | Gain_B2 |
| Amplifier 230C | Gain_B3 |
| Amplifier 230D | Gain_B4 |
| Amplifier 230E | Gain_B5 |

Figure 5B

| Component | Conditions | | | |
|---|---|---|---|---|
| | A | B | C | D |
| Filter 225A | Filter_A1 | Filter_B1 | Filter_C1 | Filter_D1 |
| Filter 225B | Filter_A2 | Filter_B2 | Filter_C2 | Filter_D2 |
| Filter 225C | Filter_A3 | Filter_B3 | Filter_C3 | Filter_D3 |
| Filter 225D | Filter_A4 | Filter_B4 | Filter_C4 | Filter_D4 |
| Filter 225E | Filter_A5 | Filter_B5 | Filter_C5 | Filter_D5 |
| Amplifier 230A | Gain_A1 | Gain_B1 | Gain_C1 | Gain_D1 |
| Amplifier 230B | Gain_A2 | Gain_B2 | Gain_C2 | Gain_D2 |
| Amplifier 230C | Gain_A3 | Gain_B3 | Gain_C3 | Gain_D3 |
| Amplifier 230D | Gain_A4 | Gain_B4 | Gain_C4 | Gain_D4 |
| Amplifier 230E | Gain_A5 | Gain_B5 | Gain_C5 | Gain_D5 |

Figure 6

ENHANCED MOBILE DEVICE AUDIO PERFORMANCE

BACKGROUND

Mobile devices are becoming increasingly sophisticated. In addition to making phone calls, consumers desire mobile devices that can play music and videos, browse the web, provide messaging (i.e., texting) capabilities, execute applications, and provide a host of other features and conveniences for the user. Indeed, some customers desire mobile devices that simultaneously perform multiple functions, such as making phone calls and browsing the web. The latest mobile devices attempt to satisfy these customer desires. Performing multiple functions or operating under poor signal conditions can degrade the quality of audio signals in the mobile device. Mobile devices are calibrated to process audio signals based on a small subset of test devices operating under particular circumstances, which may be different from how the average consumer typically uses the mobile device. Thus, the calibration process may not yield ideal calibration values for the mobile device.

BRIEF DESCRIPTION OF THE DRAWINGS

FIG. 1 illustrates an exemplary mobile device configured to process audio signals using values stored in one or more gain tables.

FIG. 2 illustrates exemplary components of the processing device of FIG. 1.

FIG. 3 is a flowchart of an exemplary process that may be implemented by the mobile device of FIG. 1.

FIG. 4 is a flowchart of another exemplary process that may be implemented by the mobile device of FIG. 1.

FIGS. 5A and 5B illustrate example gain tables.

FIG. 6 illustrates an example gain table including columns for different conditions.

DETAILED DESCRIPTION

An exemplary mobile device includes an antenna that receives a digital input signal, a processing device that processes the digital input signal and converts the digital input signal to an analog output signal, a speaker that receives the analog output signal from the processing device and outputs a sound based at least in part on the analog output signal, and a memory device that stores a plurality of gain tables, each including values associated with processing the digital signal. The processing device is configured to identify a signal strength of the digital input signal received at the antenna, select one of the plurality of gain tables based on the signal strength, and apply one or more values in the selected gain table to process at least one of the digital input signal and the analog output signal. The processing device also processes a received analog input signal according to the same gain table (e.g., the gain table selected based on the signal strength of the digital input signal). By using the values stored in the selected gain table, the mobile device may dynamically process incoming and outgoing signals according to the identified signal strength as opposed to using the same values regardless of the signal strength. Thus, the mobile device is able to process signals according to different environmental conditions (e.g., low or high signal strength) to give the user of the mobile device a better audio experience.

During low signal (e.g., RF) conditions, the mobile device may transmit signals at a higher power. Doing so may cause distortion along an audio path of the mobile device. The audio path may include a path through the mobile device that audio signals take, including audio signals received from other mobile devices and audio signals provided to the mobile device via, e.g., a microphone. The selected gain table may apply values to various components of the mobile device, such as filters and amplifiers, to reduce or minimize the effects of the distortion.

FIG. 1 illustrates an exemplary mobile device 100 for dynamically processing audio signals under different environmental conditions. The mobile device 100 may take many different forms and include multiple and/or alternate components and facilities. While an exemplary mobile device 100 is shown in the Figures, the exemplary components are not intended to be limiting. Indeed, additional or alternative components and/or implementations may be used.

As illustrated in FIG. 1, the mobile device 100 includes an antenna 105, a speaker 110, a microphone 115, a memory device 120, and a processing device 125.

The antenna 105 may be configured to receive and transmit wireless signals. The antenna 105 may include any device configured to convert electrical signals into radio waves and radio waves into electrical signals. For instance, the antenna 105 may incorporate any number of metallic conductors configured to receive an oscillating current and generate an oscillating magnetic field. The magnetic field may oscillate at a particular frequency, which may be referred to as a carrier frequency. A signal may be transmitted at the carrier frequency to other devices such as a cell tower. Moreover, the antenna 105 may be configured to receive wireless signals transmitted at one or more carrier frequencies. In one possible approach, the antenna 105 may be configured to receive and transmit digital signals in accordance with a code division multiple access (CDMA) protocol.

The speaker 110 may be configured to generate sounds according to one or more analog or digital signals. The speaker 110 may include any number of electroacoustic transducers configured to vibrate at frequencies dictated by analog or digital signals provided as input to the speaker 110. The speaker 110 may be configured to generate sounds at various frequencies, which may include frequencies associated with human speech and other sounds that humans can perceive.

The microphone 115 may be configured to generate analog or digital signals according to one or more frequencies received. The microphone 115 may include any number of electroacoustic transducers configured to convert mechanical vibration to an analog or digital signal that may represent human speech or other sounds. The microphone 115 may be configured to output the signals generated.

The memory device 120 may be configured to store information. For instance, the memory device 120 may be configured to store one or more calibration parameters associated with the operation of the mobile device 100. The calibration parameters may include values defining amplification gains or filter characteristics that may be used to process signals. The calibration parameters may be included in one or more gain tables stored in a calibration database 130. Although only one calibration database 130 is shown in FIG. 1, any number of calibration databases 130 may be included in or accessed by the memory device 120. The calibration database 130 of FIG. 1 is shown as part of the mobile device 100. In an alternative approach, the calibration database 130 may be remotely accessible to the mobile device 100 over a network.

The gain tables may be populated with values determined during testing of the mobile device 100 or components of the mobile device (e.g., the antenna 105, the speaker 110, the microphone 115) under various circumstances at the time of manufacture. For instance, the values for one gain table may be based on a test of the mobile device 100 that was performed when signals received at the mobile device 100 had a low signal strength. The values for another gain table may be based on a test of the mobile device 100 that was performed when the mobile device 100 was simultaneously running certain applications such as, e.g., a phone application, a web browsing application, and a location application. For each unique set of circumstances, different values of various components in the mobile device 100 associated with, e.g., the antenna 105, the speaker 110, the microphone 115, or any other component, may be tested to determine which values are best for processing audio signals under each of the unique set of circumstances. Thus, different calibration values for one or more filters, amplifiers, or both, associated with the antenna 105, the speaker 110, and the microphone 115 may be determined for each unique set of circumstances.

In some cases, the same calibration values for at least some components of the mobile device 100 may apply to different circumstances. For instance and by way of example only, the calibration values of the components of the microphone applied during low signal strength conditions may be the same calibration values as those applied when the mobile device 100 is simultaneously executing a web browsing application and a location application. Different calibration values may apply to the microphone 115 when the phone application is launched, however.

The gain tables may each be associated with different conditions measured by a signal strength indicator such as, e.g., a received signal strength indication (RSSI). The received signal strength indication may include a measurement of the power of a received wireless signal. In general, a higher RSSI value equates to a stronger signal strength. Each gain table may be associated with the signal strength indicator, such as an RSSI value or a range of RSSI values and a signal-to-noise ratio. The RSSI value or range of values may be limited to likely RSSI values or ranges of values of signals that the mobile device 100 is likely to receive during operation. In one possible approach, the calibration values associated with relatively high RSSI values may include smaller amplification. Likewise, signals received at relatively low RSSI values may require amplification. The gain tables may be further associated with a signal-to-noise ratio that represents the ratio of the strength of the intended signal to the strength of the noise received. The signal-to-noise ratio may be used to determine how much filtering should be applied to received signals. For instance, signals received with significant levels of noise may require more filtering than signals where the noise levels are insignificant. Signals received in a low range of RSSI values are more likely to have low signal-to-noise ratios, which could indicate that substantial noise is present and additional filtering may be desired. Applying different values based on different circumstances may improve the quality of the processed audio signals, improving the user's experience.

Other conditions may include an operating state of the mobile device 100, which in some instances may contribute to the noise or otherwise affect the ability of the mobile device 100 to process audio signals. For instance, one gain table may be associated with mobile devices 100 executing a particular application or combination of applications at any given time. An alternative or further gain table may define calibration parameters for when the mobile device 100 is engaged in a telephone call over a cellular network. Another gain table may define calibration parameters for when the mobile device 100 is both engaged in a telephone call over a cellular network and accessing information over a packet-switched network such as the Internet. Other operating states may include whether the mobile device 100 is transmitting audio signals wirelessly to a headset via, e.g., the BLUETOOTH® protocol or another type of wireless communication protocol or whether the mobile device 100 is transmitting audio signals over a wired connection to, e.g., headphones. Another type of condition may include environmental conditions. For instance, one gain table may be associated with situations with high levels of ambient or background noise such as crowded public areas (e.g., sports arenas, restaurants, clubs, etc.). Any number of gain tables for any number of circumstances, including environmental circumstances, may be stored in the calibration database 130.

Different gain tables may be developed for different types of mobile devices 100. For instance, tablet computers may apply different gain tables than smartphones. Moreover, each gain table may be associated with a particular device manufacturer, model, or both. Therefore, two mobile devices 100 by the same manufacturer may apply different gain tables. In an alternative approach, the calibration values for the different conditions or circumstances may be stored in the memory device 120 in one gain table. Different columns of the gain table, for instance, may represent the different conditions or circumstances and may be selected by the processing device 125 accordingly.

The calibration database 130 may be initially updated with gain tables at the time the mobile device 100 is manufactured. The operation of the components of the mobile device 100 may vary, however slightly, from similar components in other mobile devices. Even similar components within the same mobile device 100 may vary. For example, the output of one amplifier in the mobile device 100 may apply a slightly different gain than another amplifier, even though both are intended to theoretically apply the same gain. The gain tables may account for such variations in components between different mobile devices and even within the same mobile device. Thus, each mobile device 100 may be provided with a unique set of gain tables. During the manufacturing process of the mobile device 100, various components of the mobile device 100 may be tested and the gain tables stored on the mobile device 100 may account for the variations noted above.

The calibration database 130 may be updated after manufacture of the mobile device 100 to include different or additional gain tables. Moreover, individual calibration values may be updated as well. The updates may occur at various times, in response to newly identified conditions requiring a different set of calibration parameters, when the mobile device 100 receives a hardware or software update, or the like. The update may be initiated upon request from the mobile device 100 as part of the hardware or software update or by a remote server 135. The remote server 135 may transmit updated gain tables or updated calibration parameters according to a schedule, in response to a change made to a gain table applicable to the mobile device 100, in response to a request for updated gain tables transmitted by the mobile device 100, or other circumstances. The remote server 135 may be configured to select the appropriate gain table for the mobile device 100 based on the type of mobile device 100 (e.g., tablet computer, smartphone, etc.) and the manufacturer and model number, which may be communicated from the mobile device 100 to the remote server 135. The memory device 120 may be configured to receive a signal representing the updated calibration parameters, the updated gain tables, or both, and update the gain tables accordingly. Alternatively, if the calibration database 130 is stored remotely and accessed by the mobile device 100 over a network, the calibration database 130 may be updated without any intervention from the mobile device 100.

The processing device 125 may be configured to process signals received via the antenna 105 or microphone 115. For instance, the processing device 125 may be configured to amplify signals or filter signals according to different parameters such as the calibration parameters defined in the gain tables stored in the memory device 120. The processing device 125 may be configured to process analog signals, digital signals, or both, as well as convert analog signals received via the microphone 115 into digital signals and digital signals received from other mobile devices 100 into analog signals for the speaker 110 to output sound. Exemplary components of the processing device 125 are shown and discussed below with reference to FIG. 2.

The processing device 125 may be configured to measure a signal strength of incoming digital signals, such as digital signals received by the antenna 105. The processing device 125 may be further configured to identify an RSSI value based on the signal strength measured and store the RSSI value in the memory device 120. The processing device 125 may be configured to select one of the gain tables stored in the memory device 120 based on, e.g., the RSSI value. As discussed above, each gain table may be associated with an RSSI value or range values. The processing device 125, therefore, may be configured to select the gain table associated with the measured RSSI value. If the present RSSI value is unknown, the processing device 125 may be configured to access historical RSSI data stored in the memory device 120. The historical RSSI data may include one or more previously identified RSSI values. Thus, if the processing device 125 needs to select a gain table but no signals have been received recently, the processing device 125 may be configured to access the most recent RSSI value from the memory device 120 and select the gain table associated with that RSSI value.

Instead of or in addition to selecting gain tables based on signal strength, the processing device 125 may be configured to select one or more gain tables based, at least in part, on an operating state of the mobile device 100. The processing device 125 may be configured to determine which applications, for instance, are being executed on the mobile device 100 at any particular time and select a gain table associated with any one or combination of applications. By way of example only, the processing device 125 may be configured to select one gain table with one set of calibration parameters when the mobile device 100 is engaged in a telephone call over a cellular network and another gain table with a different set of calibration parameters when the mobile device 100 is both engaged in a telephone call over a cellular network and accessing information over a packet-switched network such as the Internet. If the gain table includes multiple columns, each associated with different conditions, the processing device 125 may be configured to select the column associated with the conditions of the mobile device 100 instead of selecting an entire gain table. The column or a combination of two or more columns, however, may be interpreted as a gain table even though it may be combined with other columns into a single gain table.

Once the gain table has been selected, the processing device 125 may be configured to process signals according to the values in the selected gain table. That is, the processing device 125 may be configured to apply the amplification gains and filtering characteristics defined in the selected gain table to process analog signals, digital signals, or both.

FIG. 2 illustrates exemplary components of the processing device 125 shown and described above relative to FIG. 1. The components shown in FIG. 2 include a codec 200, a digital signal processor 205, a pulse code modulation (PCM) interface 210, an encoder 215, and a decoder 220. Any one or more of these components may be implemented using hardware, software, or any combination of hardware and software. The processing of the signals by the codec 200, the digital signal processor 205, the PCM interface 210, the encoder 215, and the decoder 220 may be in accordance with the values stored in the selected calibration table. Each of these and possibly other components in the mobile device 100 may include one or more filters 225, amplifiers 230, or both. The mobile device 100 may therefore include dozens of filters 225 and amplifiers 230 that have associated calibration values. Different calibration values may be associated with each of the filters 225 and amplifiers 230.

The codec 200 may be configured to encode and decode signals such as signals received from the microphone 115 or output to the speaker 110. For instance, the codec 200 may be configured to receive analog input signals from, e.g., the microphone 115 and convert the analog input signal into a digital signal. Likewise, the codec 200 may be configured to convert digital signals into analog output signals that may be output to the speaker 110. Thus, the codec 200 may include any number of analog-to-digital (A/D) converters, digital-to-analog (D/A) converters, or both. The codec 200 may further include filters 225A, amplifiers 230A, or both.

The digital signal processor 205 is configured to process digital signals. As discussed above, processing digital signals may include amplifying signals or filtering signals according to different parameters such as the calibration parameters defined in the gain tables stored in the memory device 120. To amplify signals, the digital signal processor 205 may include one or more electronic amplifiers 230B configured to increase the power of at least a portion of a digital signal. The filters 225B may be configured to remove certain components, such as noise, from the digital signal. Moreover, the digital signal processor 205 may be configured to compress digital signals. As illustrated in FIG. 2, the digital signal processor 205 may be configured to process digital signals received, through the PCM interface 210, from the decoder 220 and digital signals received from the codec 200 (i.e., analog input signals converted to digital signals via the codec 200).

The PCM interface 210 may be configured to transfer signals between the digital signal processor 205 and other components such as the encoder 215 and decoder 220. In one exemplary approach, the PCM interface 210 may be configured to provide digital signals from the digital signal processor 205 to the encoder 215 and decoded digital signals from the decoder 220 to the digital signal processor 205. The PCM interface 210 may be configured to process signals received from the digital signal processor 205 prior to additional processing performed at the encoder 215. Likewise, the PCM interface 210 may be configured to process signals received from the decoder 220 and provided to the digital signal processor 205 for additional processing. The PCM interface 210 may further include filters 225C, amplifiers 230C, or both.

The encoder 215 may be configured to convert signals from one format to another using any number of filters 225D, amplifiers 230D, or other components. For instance, the encoder 215 may be configured to receive digital signals from the PCM interface 210 and encode the received signal to conform to a communication protocol such as the CDMA protocol. The encoded signal may be received and processed by other mobile devices 100 configured to receive and process CDMA signals. For purposes of simplicity and clarity, only encoding in accordance with the CDMA protocol is discussed, but the encoder 215 may be configured to encode signals according to different or additional protocols as well. The encoded signals may be transmitted to and processed by other mobile devices 100.

The decoder 220 may be configured to convert signals from one format to another. In general, the decoder 220 may be configured to decode signals encoded by and transmitted from other mobile devices 100. The decoder 220 may be configured to decode encoded signals according to a communication protocol such as the CDMA protocol. In one possible implementation, the decoder 220 may be configured to receive encoded signals from other mobile devices 100 and decode the received encoded signals so that the decoded signals may be processed by the digital signal processor 205 and codec 200 prior to generating sound based, at least in part, on the signal received. The decoder 220 may include any number of filters 225E, amplifiers 230E, or both.

The codec 200, the digital signal processor 205, the PCM interface 210, the encoder 215, and the decoder 220 may each be configured to process signals by, e.g., amplifying received signals according to a gain defined by at least one value stored in the selected gain table or filtering the received signals according to parameters defined by at least one value in the selected gain table. As discussed above, the gain table is selected based on a received signal strength indication value of the received digital input signal or the operating state of the mobile device 100. The values in the selected gain table may be applied to the filters 225, amplifiers 230, or both contained in the mobile device 100. By using values in the gain table, each of these exemplary components of the processing device 125 is configured to process signals according to the received signal strength indication.

In general, computing systems and/or devices, such as the processing device 125, may employ any of a number of computer operating systems, including, but by no means limited to, versions and/or varieties of the Microsoft Windows® operating system, the Unix operating system (e.g., the Solaris® operating system distributed by Oracle Corporation of Redwood Shores, Calif.), the AIX UNIX operating system distributed by International Business Machines of Armonk, N.Y., the Linux operating system, the Mac OS X and iOS operating systems distributed by Apple Inc. of Cupertino, Calif., the BlackBerry OS distributed by Research In Motion of Waterloo, Canada, and the Android operating system developed by the Open Handset Alliance. Examples of computing devices include, without limitation, a computer workstation, a server, a desktop, notebook, laptop, or handheld computer, or some other computing system and/or device.

Computing devices generally include computer-executable instructions, where the instructions may be executable by one or more computing devices such as those listed above. Computer-executable instructions may be compiled or interpreted from computer programs created using a variety of programming languages and/or technologies, including, without limitation, and either alone or in combination, Java™, C, C++, Visual Basic, Java Script, Perl, etc. In general, a processor (e.g., a microprocessor) receives instructions, e.g., from a memory, a computer-readable medium, etc., and executes these instructions, thereby performing one or more processes, including one or more of the processes described herein. Such instructions and other data may be stored and transmitted using a variety of computer-readable media.

A computer-readable medium (also referred to as a processor-readable medium) includes any non-transitory (e.g., tangible) medium that participates in providing data (e.g., instructions) that may be read by a computer (e.g., by a processor of a computer). Such a medium may take many forms, including, but not limited to, non-volatile media and volatile media. Non-volatile media may include, for example, optical or magnetic disks and other persistent memory. Volatile media may include, for example, dynamic random access memory (DRAM), which typically constitutes a main memory. Such instructions may be transmitted by one or more transmission media, including coaxial cables, copper wire and fiber optics, including the wires that comprise a system bus coupled to a processor of a computer. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, an EPROM, a FLASH-EEPROM, any other memory chip or cartridge, or any other medium from which a computer can read.

Databases, data repositories or other data stores described herein may include various kinds of mechanisms for storing, accessing, and retrieving various kinds of data, including a hierarchical database, a set of files in a file system, an application database in a proprietary format, a relational database management system (RDBMS), etc. Each such data store is generally included within a computing device employing a computer operating system such as one of those mentioned above, and are accessed via a network in any one or more of a variety of manners. A file system may be accessible from a computer operating system, and may include files stored in various formats. An RDBMS generally employs the Structured Query Language (SQL) in addition to a language for creating, storing, editing, and executing stored procedures, such as the PL/SQL language mentioned above.

In some examples, system elements may be implemented as computer-readable instructions (e.g., software) on one or more computing devices (e.g., servers, personal computers, etc.), stored on computer readable media associated therewith (e.g., disks, memories, etc.). A computer program product may comprise such instructions stored on computer readable media for carrying out the functions described herein.

FIG. 3 illustrates an exemplary process 300 that may be implemented by the processing device 125 when digital signals are received.

At block 305, the processing device 125 may receive a digital input signal via the antenna 105. The digital input signal may have been generated by and transmitted from another mobile device (not shown). In one possible approach, the digital input signal may represent a human voice or other sounds perceptible to a human.

At block 310, the processing device 125 may identify a signal strength of the digital input signal received. One way to identify the signal strength may include measuring a power of the received digital signal. The processing device 125 may be configured to associate the signal strength to a received signal strength indication value or range of values based on, e.g., the measured power. Alternatively or in addition, the processing device 125 may determine an operating state of the mobile device 100 at block 310. The operating state may include an identification of an application or combination of applications running on the mobile device 100 at any particular time.

At block 315, the processing device 125 may be configured to select one of the gain tables based on, for instance, the signal strength or operating state determined at block 310. Because the signal strength represents the power of the digital input signal received, the selected gain table may reflect the calibration parameters that should be applied to signals having similar signal strengths, mobile devices 100 operating under similar operating conditions, or both. Example calibration parameters include the value of amplification gains or filter characteristics that may be applied to the received digital input signal.

At block 320, the processing device 125 may be configured to process the digital input signal received at block 305 by applying the calibration parameters in the gain table selected at block 315 to the digital input signal. In one possible approach, processing the received digital input signal may include amplifying the digital input signal or filtering the digital input signal. Amplifying the digital input signal may include increasing the power of at least a portion of a digital signal according to an amplification gain defined in the selected gain table. Filtering the digital input signal may include removing certain components, such as noise, from the digital input signal based on calibration values in the selected gain table. Processing the digital input signal may further or alternatively include compressing the digital input signal. Components involved in the processing of the digital input signal may include the decoder 220 to decode the digital input signal, the PCM interface 210, the digital signal processor 205, and the codec 200.

At block 325, the processing device 125 may generate an analog output signal based on, e.g., the processed digital input signal. The analog output signal may represent human speech or other sounds perceptible to humans contained in the digital input signal. In one possible approach, the codec 200 may convert the processed digital input signal into the analog output signal.

At block 330, the processing device 125 may output the analog output signal generated at block 330. In one possible implementation, the analog output signal may be output from the codec 200 to the speaker 110, causing the speaker 110 to create sounds based on the analog output signal. That is, the speaker 110 may vibrate in accordance with the analog output signals at various frequencies, at least some of which may be perceptible to humans.

The process 300 may end after block 330, return to block 305 when another digital input signal is received, or continue at block 405 in the process 400 of FIG. 4 if an analog input signal is received.

FIG. 4 illustrates another exemplary process 400 that may be used by the processing device 125 upon receipt of analog signals.

At block 405, the processing device 125 may receive an analog input signal via the microphone 115. The analog input signal may have been generated from vibrations of the microphone 115 caused by, e.g., human speech or other sound waves provided to the microphone 115. Thus, the analog input signal may represent a human voice or other sounds perceptible to a human.

At block 410, the processing device 125 may identify a signal strength or operating state of the mobile device 100. One way to identify the signal strength may include measuring a power of the received digital input signal, such as the digital input signal received at block 305 in the process 300 of FIG. 3. If a digital input signal was recently received, the processing device 125 may identify the signal strength from, e.g., the RSSI value of the recently received signal. If no digital input signal has been received recently, the processing device 125 may identify the signal strength from historical data stored in the memory device 120. The historical data may include the RSSI value associated with the most recent digital input signal received. The processing device 125 may be configured to associate the signal strength to a received signal strength indication (RSSI) value or range of values based on, e.g., the measured power of the digital input signal. One way to identify the operating state may be for the processing device 125 to determine which application or combination of applications is running on the mobile device 100 at any particular time.

At block 415, the processing device 125 may be configured to select one of the gain tables based on, for instance, the signal strength of the digital input signal or operating state of the mobile device 100 determined at block 410. Because the signal strength represents the power of the digital input signal received, the selected gain table may reflect the calibration parameters that should be applied to signals having similar signal strengths, mobile devices 100 operating under similar operating conditions, or both. Further, although the signal strength is based on a digital input signal, the processing device 125 may determine that the same calibration parameters (i.e., the same gain table) should be applied to analog input signals as well. As discussed above, example calibration parameters may include the value of amplification gains or filter characteristics that may be applied to the received analog input signal.

At block 420, the processing device 125 may be configured to process the analog input signal received at block 405 by applying the calibration parameters in the gain table selected at block 415 to the analog input signal. In one possible approach, processing the received analog input signal may include amplifying the analog input signal or filtering the analog input signal. Amplifying the digital input signal may include increasing the power of at least a portion of a digital signal according to an amplification gain defined in the selected gain table. Filtering the digital input signal may include removing certain components, such as noise, from the analog input signal based on calibration values in the selected gain table. Processing the analog input signal may further or alternatively include compressing the analog input signal. Components involved in the processing of the analog input signal may include the encoder 215 to encode the analog input signal, the PCM interface 210, the digital signal processor 205, and the codec 200.

At block 425, the processing device 125 may generate a digital output signal based on, e.g., the processed analog input signal. The digital output signal may represent human speech or other sounds perceptible to humans in a digital format. In one possible approach, the codec 200 may convert the analog input signal into a digital format that may be encoded by the encoder 215. The output of the encoder 215 may include the digital output signal, which may be encoded according to a communication protocol such as CDMA.

At block 430, the processing device 125 may transmit the encoded digital output signal to the antenna 105 for transmission to, e.g., another mobile device (not shown).

The process 400 may end after block 430, return to block 405 when another analog input signal is received, or continue at block 305 if a digital input signal is received.

FIGS. 5A and 5B illustrate example gain tables that may be stored in the memory device 120. As discussed above, these gain tables may be developed during manufacture of the mobile device 100, and the values stored in the gain tables may help reduce distortion caused by various conditions such as those identified above. The gain tables list various components of the mobile device 100 and values associated with each component. For instance, in the example of FIG. 5A, a value labeled "Filter_A1" may be applied to the filter 225A, which as discussed above may be part of the codec 200. A different value, represented as "Filter_A2" may be applied to the filter 225B, which as discussed above may be part of the digital signal processor 205. The values of FIG. 5A may apply when "Condition A" is in effect. "Condition A" may represent a signal strength, one or more operating conditions of the mobile device 100, or an environmental condition, as discussed above. FIG. 5B illustrates another gain table that may be applied under different conditions. As illustrated, the values applied to each component are different than in FIG. 5A. It may be possible, however, for some values to remain the same even though the conditions are different. In other words, some values applied for "Condition A" may also be used for "Condition B." Thus, "Filter_A3" may represent the same value as "Filter_B3." The processing device 125, as discussed above, may be configured to select one of the gain tables based on various conditions and apply the listed values to the associated components.

FIG. 6 illustrates an exemplary approach where multiple conditions are combined into a single gain table. The gain table of FIG. 6 includes four conditions labeled "A," "B," "C," and "D." Instead of selecting among multiple gain tables, the processing device 125 may be configured to select a column. That is, if it is determined that the mobile device 100 is operating under "Condition A," the processing device 125 may select column "A" and apply the values in column A to the associated components.

By using the values stored in the selected gain table, the mobile device 100 may dynamically process incoming and outgoing signals according to the identified signal strength as opposed to using the same values regardless of the signal strength. Thus, the mobile device 100 is able to process signals according to different environmental conditions and give the user of the mobile device 100 a better experience. The gain tables may be developed during a manufacturing process to account for variations of components used in the mobile device 100. Moreover, the values of the gain table may be used to reduce distortion along the audio path that may occur under various conditions, such as those discussed above.

With regard to the processes, systems, methods, heuristics, etc. described herein, it should be understood that, although the steps of such processes, etc. have been described as occurring according to a certain ordered sequence, such processes could be practiced with the described steps performed in an order other than the order described herein. It further should be understood that certain steps could be performed simultaneously, that other steps could be added, or that certain steps described herein could be omitted. In other words, the descriptions of processes herein are provided for the purpose of illustrating certain embodiments, and should in no way be construed so as to limit the claims.

Accordingly, it is to be understood that the above description is intended to be illustrative and not restrictive. Many embodiments and applications other than the examples provided would be apparent upon reading the above description. The scope should be determined, not with reference to the above description, but should instead be determined with reference to the appended claims, along with the full scope of equivalents to which such claims are entitled. It is anticipated and intended that future developments will occur in the technologies discussed herein, and that the disclosed systems and methods will be incorporated into such future embodiments. In sum, it should be understood that the application is capable of modification and variation.

All terms used in the claims are intended to be given their broadest reasonable constructions and their ordinary meanings as understood by those knowledgeable in the technologies described herein unless an explicit indication to the contrary in made herein. In particular, use of the singular articles such as "a," "the," "said," etc. should be read to recite one or more of the indicated elements unless a claim recites an explicit limitation to the contrary.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

The invention claimed is:

1. A mobile device comprising:
    an antenna configured to (i) transmit a digital output signal in accordance with a communication protocol and (ii) receive a digital input signal;
    a microphone configured to receive an analog input signal;
    a processing device configured to (i) receive the analog input signal from the microphone, (ii) convert the analog input signal to the digital output signal according to the communication protocol, and (iii) convert the digital input signal to an analog output signal;
    at least one amplifier and at least one filter; and
    a memory device configured to store a plurality of gain tables, each including values associated with processing the digital input signal, and
    wherein the processing device is further configured to identify a signal strength of the digital input signal, select one of the plurality of gain tables based on the signal strength, and (i) apply one or more values in the selected gain table to the at least one amplifier and (ii) apply one or more values in the selected gain table to the at least one filter to process at least one of the digital input signal and the analog output signal, and (iii) process the analog input signal and the digital output signal according to values in the selected gain table based on the signal strength of the digital input signal.

2. The mobile device of claim 1, wherein processing the digital input signal includes filtering the digital input signal using the at least one filter and wherein the filtering is associated with at least one parameter defined by at least one value stored in the selected gain table.

3. The mobile device of claim 1, wherein processing the digital input signal includes amplifying the digital input signal, using the at least one amplifier, according to a gain defined by at least one value stored in the selected gain table.

4. The mobile device of claim 1, wherein the selection of the one of the plurality of gain tables is further based on an operating state of the mobile device selected from a plurality of operating states, and wherein the plurality of operating states includes at least one of: (i) a state in which the mobile device is executing a combination of applications; (ii) a state in which the mobile device is engaged in a telephone call and engaged in accessing information over the internet; and (iii) a state in which the mobile device is transmitting audio signals to a wireless headset.

5. The mobile device of claim 4, wherein the processing device includes a digital signal processor configured to process a decoded digital input signal.

6. The mobile device of claim 5, wherein the processing device includes a pulse code modulation interface configured to provide the decoded digital input signal to the digital signal processor from a decoder.

7. The mobile device of claim 5, wherein the processing device includes a codec configured to convert the decoded digital input signal to the analog output signal.

8. A processing device comprising:
a decoder configured to decode a digital input signal according to a communication protocol;
a digital signal processor configured to process the decoded digital input signal;
a pulse code modulation interface configured to provide the decoded digital input signal to the digital signal processor from the decoder; and
a codec configured to convert the decoded digital input signal from the digital signal processor to an analog output signal; and
wherein the processing device is configured to identify a signal strength of the digital input signal, select one of a plurality of gain tables based on the signal strength, and apply one or more values in the selected gain table to at least one of the decoder, the digital signal processor, and the codec to process at least one of the digital input signal and the analog output signal, wherein processing the digital input signal includes amplifying the digital input signal, using at least one amplifier, according to a gain defined by at least one value stored in the selected gain table, and wherein the selection of the gain table is further based on an operating state of a mobile device selected from a plurality of operating states, the plurality of operating states includes at least two of: (i) a state in which the mobile device is executing a combination of applications; (ii) a state in which the mobile device is engaged in a telephone call and engaged in accessing information over the internet; and (iii) a state in which the mobile device is transmitting audio signals to a wireless headset.

9. The processing device of claim 8, wherein at least one of the decoder, the digital signal processor, the pulse code modulation interface, and the codec is configured to filter the digital input signal and wherein the filtering is associated with at least one parameter defined by at least one value stored in the selected gain table.

10. The processing device of claim 8, wherein at least one of the decoder, the digital signal processor, the pulse code modulation interface, and the codec is configured to amplify the digital input signal according to a gain defined by at least one value stored in the selected gain table.

11. The processing device of claim 8, wherein the processing device is configured to process an analog input signal and a digital output signal according to the values in the gain table selected based on the signal strength of the digital input signal.

12. A method comprising:
receiving a digital input signal;
identifying a signal strength of the digital input signal;
selecting one of a plurality of gain tables, each including values associated with processing the digital signal, wherein the gain table is selected based on the identified signal strength and an operating state of a mobile device selected from a plurality of operating states, and wherein the plurality of operating states includes at least two of: (i) a state in which the mobile device is executing a combination of applications; (ii) a state in which the mobile device is engaged in a telephone call and engaged in accessing information over the internet; and (iii) a state in which the mobile device is transmitting audio signals to a wireless headset; and
processing the digital input signal based at least in part on the values in the selected gain table to convert the digital input signal to an analog output signal, wherein processing the digital input signal comprises:
filtering the digital input signal and wherein the filtering is associated with at least one parameter defined by at least one value in the selected gain table; and
amplifying the digital input signal according to a gain defined by at least one value stored in the selected gain table.

13. The method of claim 12, wherein processing the digital input signal includes applying one or more of the values in the selected gain table to at least one of the digital input signal and the analog output signal.

14. The method of claim 12, wherein processing the digital input signal includes:
decoding the digital input signal according to a communication protocol; and
converting the decoded digital input signal to the analog output signal.

15. The method of claim 12, further comprising:
receiving an analog input signal;
converting the analog input signal to a digital output signal according to a communication protocol; and
processing at least one of the analog input signal and the digital output signal according to the values in the gain table selected based at least in part on the signal strength of the digital input signal.

16. The method of claim 15, further comprising:
encoding the digital output signal according to a communication protocol to generate the digital output signal; and
transmitting the encoded digital output signal to a mobile device.

17. The method of claim 12, further comprising outputting a sound based at least in part on the analog output signal.

18. The method of claim 12, wherein selecting one of the plurality of gain tables is further based on a level of ambient noise.

* * * * *